US009946478B2

(12) United States Patent
Tan

(10) Patent No.: US 9,946,478 B2
(45) Date of Patent: Apr. 17, 2018

(54) MEMORY MANAGING METHOD, MEMORY CONTROL CIRCUIT UNIT AND MEMORY STORAGE APPARATUS

(71) Applicant: PHISON ELECTRONICS CORP., Miaoli (TW)

(72) Inventor: Kok-Yong Tan, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 36 days.

(21) Appl. No.: 15/145,814

(22) Filed: May 4, 2016

(65) Prior Publication Data

US 2017/0262197 A1 Sep. 14, 2017

(30) Foreign Application Priority Data

Mar. 9, 2016 (TW) .............................. 105107162 A

(51) Int. Cl.
*G06F 3/06* (2006.01)
*G11C 16/34* (2006.01)
(52) U.S. Cl.
CPC ............ *G06F 3/0619* (2013.01); *G06F 3/065* (2013.01); *G06F 3/0688* (2013.01); *G11C 16/3427* (2013.01); *G11C 16/3431* (2013.01)
(58) Field of Classification Search
CPC ...... G06F 3/0688; G06F 3/0619; G06F 3/065; G11C 16/3431

USPC ......................................................... 711/103
See application file for complete search history.

(56) References Cited

U.S. PATENT DOCUMENTS

2012/0268995 A1* 10/2012 Sugimoto ............ G11C 16/349
365/185.11
2014/0173239 A1* 6/2014 Schushan ........... G11C 16/3427
711/165
2014/0281766 A1* 9/2014 Yang .................... G06F 11/0793
714/721

FOREIGN PATENT DOCUMENTS

WO        2015196153       12/2015

OTHER PUBLICATIONS

"Office Action of Taiwan Counterpart Application," dated Jan. 3, 2017, p. 1-p. 7.

* cited by examiner

*Primary Examiner* — Jasmine Song
(74) *Attorney, Agent, or Firm* — JCIPRNET

(57) ABSTRACT

A memory managing method, a memory control circuit unit and a memory storage apparatus are provided. The method includes: setting a read-disturb threshold for each of a plurality of physical erasing units; adjusting the read-disturb threshold of a first physical erasing unit according to state information of a rewritable non-volatile memory module; and performing a read-disturb prevention operation according to the read-disturb threshold of the first physical erasing unit.

6 Claims, 11 Drawing Sheets

MEMORY MANAGING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 105107162, filed on Mar. 9, 2016. The entirety of the above-mentioned patent application is hereby incorporated by reference herein and made a part of this specification.

BACKGROUND

Technical Field

A memory managing method, a memory control circuit unit and a memory storage apparatus are provided.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a memory storage apparatus which utilizes a flash memory module as a storage medium. For these reasons, the flash memory has become an import part of the electronic industries.

In general, the rewritable non-volatile memory module usually includes a plurality of physical erasing units, and each of the physical erasing units includes a plurality of physical programming units. Particularly, the physical erasing unit in the rewritable non-volatile memory module has a limited number of times in terms of an erase count. For example, the physical erasing unit may be worn out after experiencing an erase operation for over ten thousand times. When one specific physical erasing unit is worn out, error bits may be generated while programming (or writing) the data into that specific physical erasing unit. In severe case, it also leads to adverse effects such as data loss or data storage failure.

In addition, after the data stored in one specific physical programming unit in one physical erasing unit is repeatedly read for multiple times (e.g., with a read count from hundred thousand times to million times), it is highly possibly that the data stored by the specific physical erasing unit may generate error bits or may be lost due to applied read voltage. Worth yet, the data stored in other physical programming units of the same physical erasing unit may also generate error bits or may be lost. This kind of phenomenon is commonly referred to as "read-disturb" by person with ordinary skill in the art.

Because the read-disturb and waring phenomenons will occur in the rewritable non-volatile memory module with uses of the physical erasing unit over time, manufacturers must develop various memory managing methods to overcome those phenomenons, so as to effectively reduce a wearing probability and control an occurrence probability of the read-disturb for the physical erasing unit.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a memory managing method, a memory control circuit unit and a memory storage apparatus, which are capable of effectively reducing the wearing probability and controlling the occurrence probability of the read-disturb for the physical erasing unit, so as to improve life time and reliability of the rewritable non-volatile memory module.

The present invention provides a memory managing method for a rewritable non-volatile memory module. The rewritable non-volatile memory module has a plurality of physical erasing units, and each of the physical erasing units has a plurality of physical programming units. The memory managing method includes: setting a read-disturb threshold for each of a plurality of physical erasing units; adjusting the read-disturb threshold of a first physical erasing unit according to state information of a rewritable non-volatile memory module; and performing a read-disturb prevention operation according to the read-disturb threshold of the first physical erasing unit.

An exemplary embodiment of the invention provides a memory control circuit unit for controlling a rewritable non-volatile memory module. The memory control circuit unit includes: a host interface configured to couple to a host system; a memory interface configured to couple to the rewritable non-volatile memory module, wherein the rewritable non-volatile memory module has a plurality of physical erasing units, and each physical erasing unit among the physical erasing units has a plurality of physical programming units; and a memory management circuit coupled to the host interface and the memory interface. The memory management circuit is configured to set a read-disturb threshold for each of a plurality of physical erasing units, adjust the read-disturb threshold of a first physical erasing unit according to state information of a rewritable non-volatile memory module, and perform a read-disturb prevention operation according to the read-disturb threshold of the first physical erasing unit.

An exemplary embodiment of the invention provides a memory storage apparatus, which includes: a connection interface unit configured to couple to a host system, a rewritable non-volatile memory module, and a memory control circuit unit coupled to the connection interface unit and the rewritable non-volatile memory module. The rewritable non-volatile memory module has a plurality of physical erasing units, and each physical erasing unit among the physical erasing units has a plurality of physical programming units. The memory control circuit unit includes: set a read-disturb threshold for each of a plurality of physical erasing units, adjust the read-disturb threshold of a first physical erasing unit according to state information of a rewritable non-volatile memory module, and perform a read-disturb prevention operation according to the read-disturb threshold of the first physical erasing unit.

Based on the above, the invention proposes to dynamically adjust the read-disturb threshold according to the erase count of the physical erasing unit, so as to effectively reduce the wearing probability or the occurrence probability of the read-disturb for the physical erasing unit.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
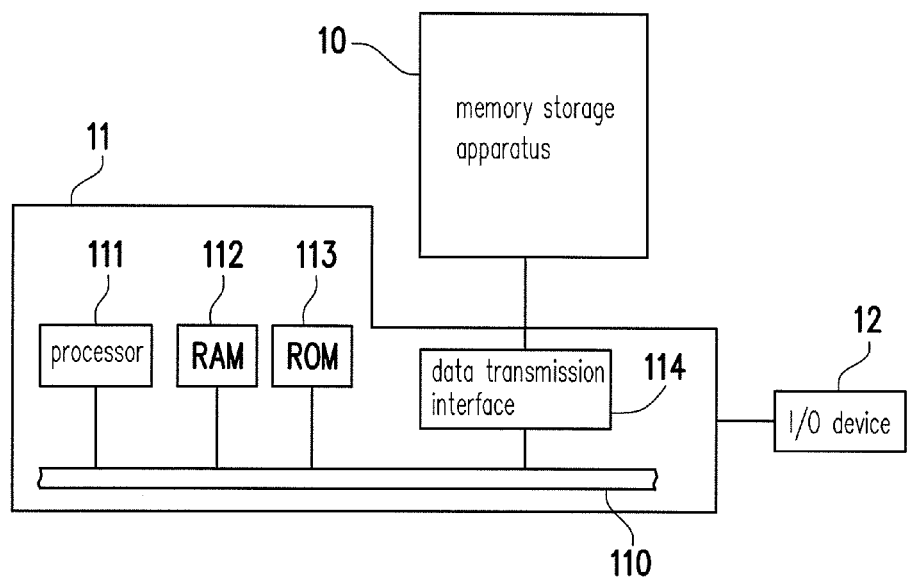
FIG. 1 is a schematic diagram illustrating a host system, a memory storage apparatus and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit unit). The memory storage apparatus is usually configured together with a host system so that the host system may write data into the memory storage apparatus or read data from the memory storage apparatus.

Figure 2:
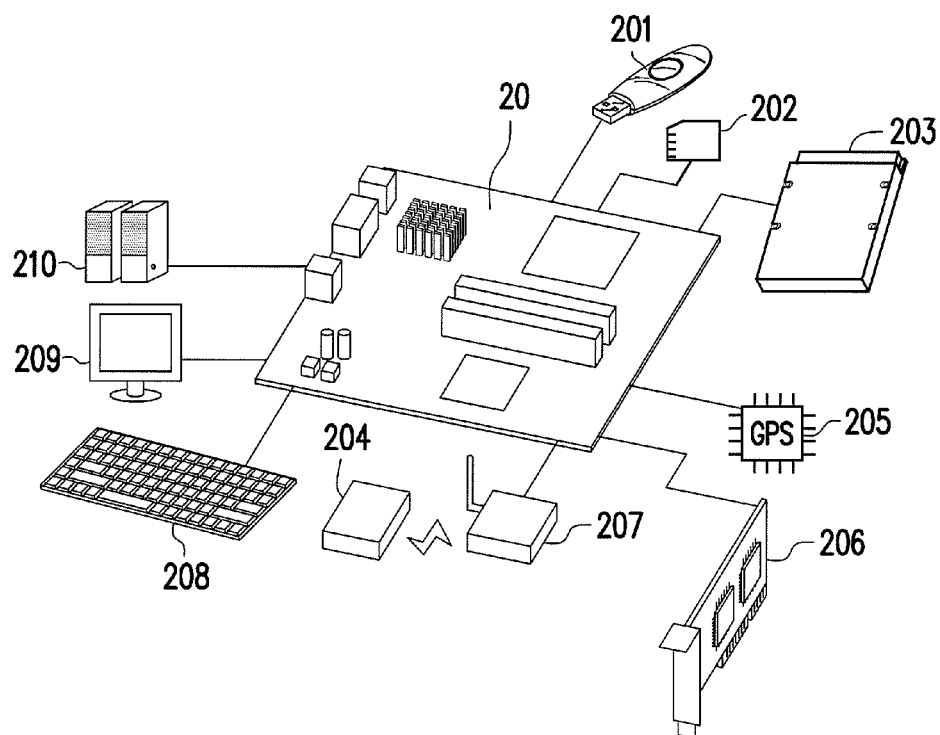
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 may write data into the memory storage apparatus 10 or read data from the memory storage apparatus 10 through the data transmission interface 114. Further, the host system 111 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 are disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage apparatus 204 through the wireless transmission device 207.

Figure 3:
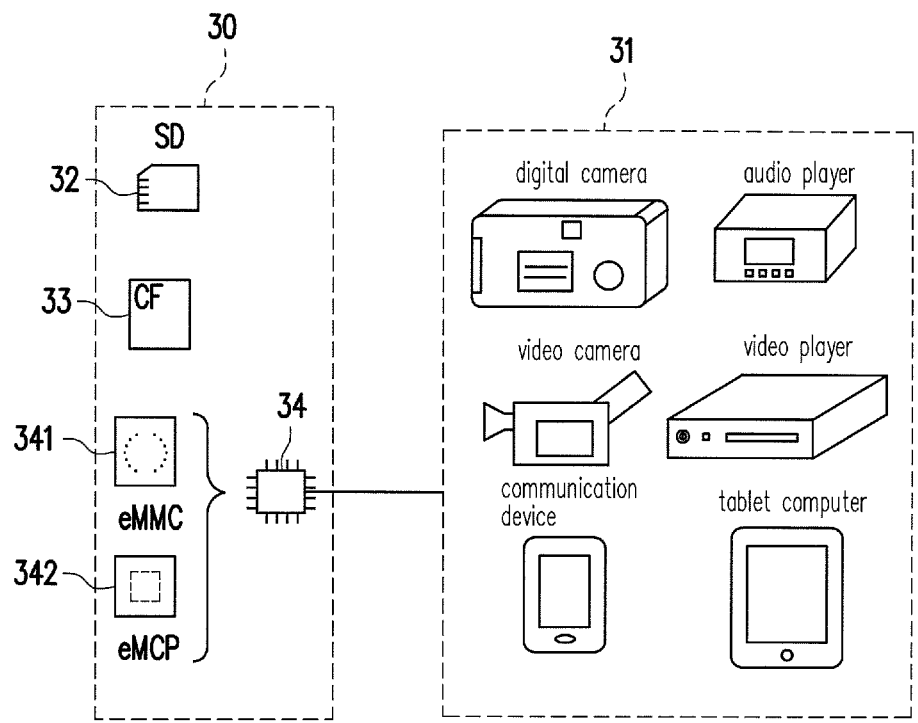
FIG. 3 is a schematic diagram illustrating a host system and a memory storage apparatus according to an exemplary embodiment of the invention.

In an exemplary embodiment, aforementioned host system may be any systems capable of substantially cooperating with the memory storage apparatus for storing data. The host system is illustrated as a computer system in foregoing exemplary embodiment; however, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
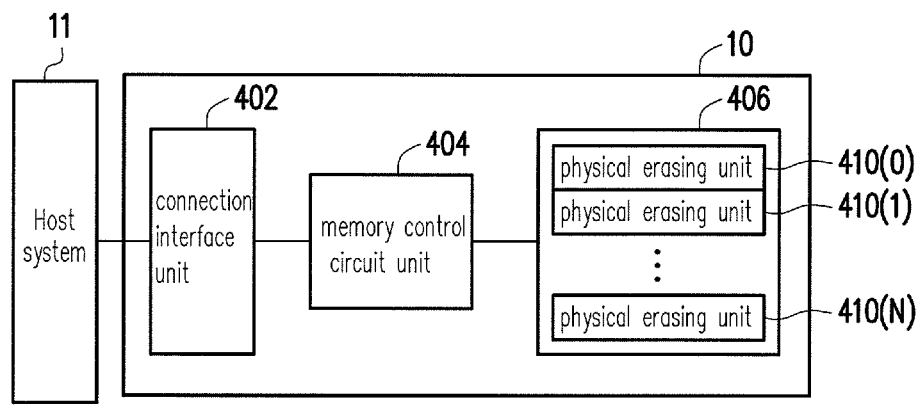
FIG. 4 is a schematic block diagram illustrating a host system and a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the present invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control instructions which are implemented in form of hardware or firmware, so as to execute operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited thereto. Each physical erasing unit may be constituted by 64 physical programming units, 256 physical programming units or any amount of the physical programming units.

More specifically, the physical erasing unit is a minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the physical programming unit contains 8 physical access addresses, and the size of each physical access address is 512 byte. However, in other exemplary embodiments, the data bit area may also contain more or less physical access addresses, and the number and size of the physical access addresses are not limited by the invention. For example, in one exemplary embodiment, the physical erasing unit is a physical block, and the physical programming unit is a physical page or a physical sector, but the present invention is not limited thereto.

In the present exemplary embodiment, the rewritable non-volatile memory module 406 is a Trinary Level Cell (TLC) NAND-type flash memory module (i.e., a flash memory module capable of storing three data bits in one memory cell). However, the disclosure is not limited thereto. The rewritable non-volatile memory module 406 may also be a Multi Level Cell (MLC) NAND-type flash memory module (i.e., a flash memory module capable of storing two data bits in one memory cell) or other memory module having the same features.

Figure 5:
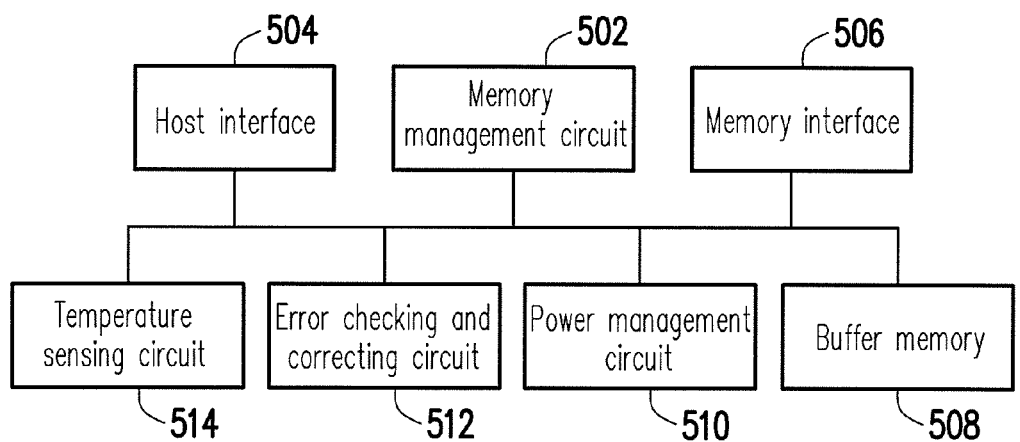
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 404 includes a memory management circuit 502, a host interface 504, a memory interface 506, a buffer memory 508, a power management circuit 510, an error checking and correcting circuit 512 and a temperature sensing circuit 514.

The memory management circuit 502 is configured to control overall operation of the memory control circuit unit 404. Specifically, the memory management circuit 502 has a plurality of control instructions. During operation of the memory storage apparatus 10, the control instructions are executed to execute various operations such as writing, reading and erasing data.

In the present exemplary embodiment, the control instructions of the memory management circuit 502 are implemented in form of firmware. For instance, the memory management circuit 502 has a microprocessor unit (not illustrated) and a read-only memory (not illustrated), and the control instructions are burnt into the read-only memory. When the memory storage apparatus 10 operates, the control instructions are executed by the microprocessor to perform operations of writing, reading or erasing data.

Figure 6:
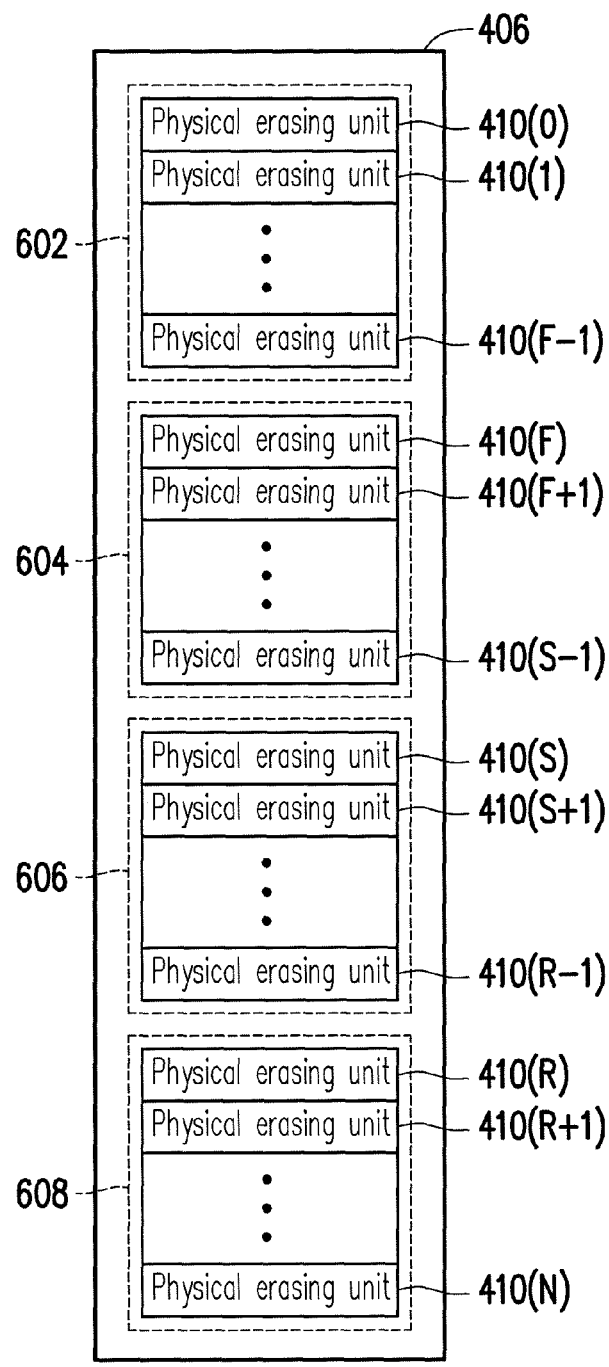
FIG. 6 and FIG. 7 are schematic diagrams illustrating a management of the physical erasing units according to an exemplary embodiment.
Figure 7:
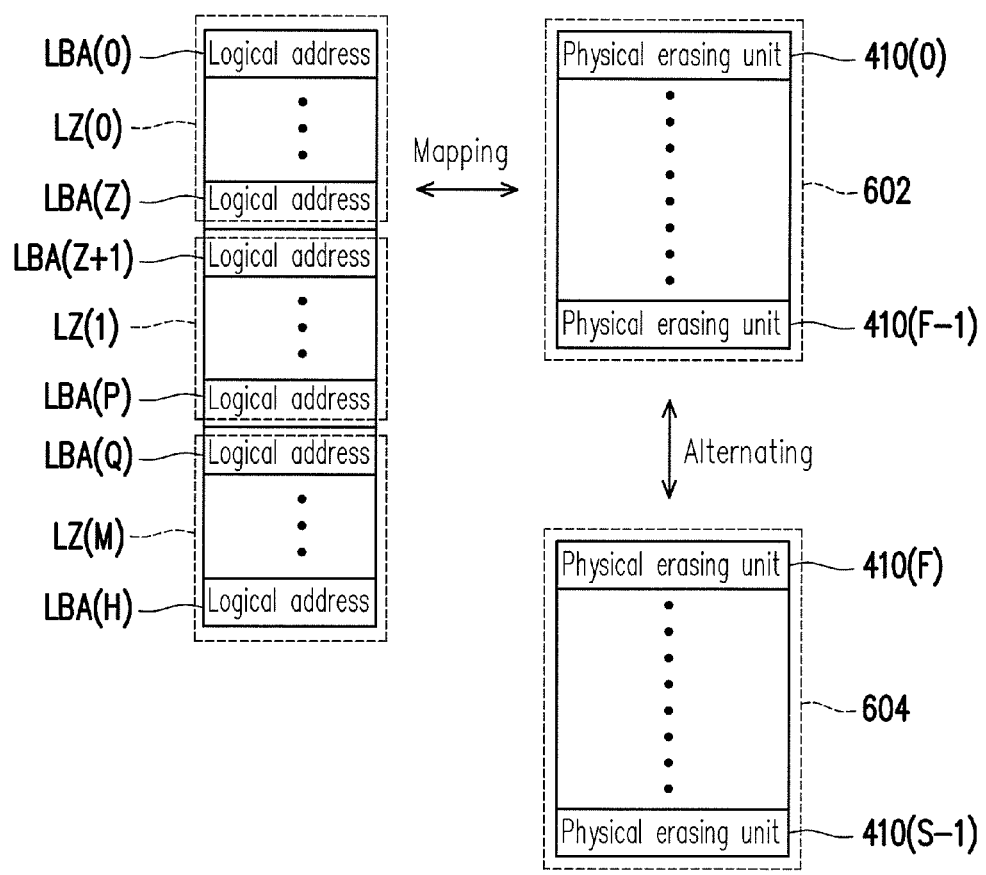

FIG. 6 and FIG. 7 are schematic diagrams illustrating a management of the physical erasing units according to an exemplary embodiment.

It should be understood that terms, such as "get", "select", "retrieve", "group", "divide", "associate" and so forth, are logical concepts which describe operations in the physical erasing units of the rewritable non-volatile memory module 406. That is, the physical erasing units of the rewritable non-volatile memory module are logically operated, but actual positions of the physical units of the rewritable non-volatile memory module are not changed.

Referring to FIG. 6, the memory control circuit unit 404 (or the memory management circuit 502) may logically group the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with the data, whereas the physical erasing units of the spare area 604 are configured to replace the physical erasing units of the data area 602. In other words, when the write command and the data to be written are received from the host system 11, the memory management unit 502 uses the physical erasing units selected from the spare area 604 for writing data as a replacement to the physical erasing units in the data area 602.

The physical erasing units logically belonging to the system area 606 are configured to record system data. For example, the system data includes information related to manufacturer and model of the rewritable non-volatile memory module, the number of physical erasing units in the rewritable non-volatile memory module, the number of the physical programming units in each physical erasing unit, and so forth.

The physical erasing units logically belonging to the replacement area 608 are used in a bad physical erasing unit replacement procedure for replacing damaged physical erasing units. More specifically, if the replacement area 608 still includes normal physical erasing units when the physical erasing units of the data area 602 are damaged, the memory management circuit 502 selects the normal physical erasing units from the replacement area 608 for replacing the damaged physical erasing units.

Particularly, the numbers of the physical erasing units in the data area 602, the spare area 604, the system area 606 and the replacement area 608 may be different from one another according to the different memory specifications. In addition, it should be understood that, during operation of the memory storage apparatus 10, grouping relations of the physical erasing units for associating with the data area 602, the spare area 604, the system area 606, and the replacement area 608 may be dynamically changed. For example, when the damaged physical erasing units in the spare area 604 are replaced by the physical erasing units in the replacement area 608, the physical erasing units originally from the replacement area 608 are then associated with the spare area 604.

Referring to FIG. 7, the memory control circuit unit 404 (or the memory management circuit 502) assigns logical addresses LBA(0) to LBA(H) for mapping to the physical erasing units of the data area 602, wherein each of the logical addresses includes a plurality of logical units for mapping to the corresponding physical programming units of the physical erasing units. When the host system 11 intends to write the data into the logical addresses or update the data stored in the logical addresses, the memory control circuit unit 404 (or the memory management unit 502) selects one physical erasing unit from the spare area 604 as an active physical erasing unit to alternate the physical erasing units of the data area 602 for writing data. Further, when the active physical erasing unit serving as the active physical erasing unit is fully written, the memory control circuit unit 404 (or the memory management circuit 502) again selects an empty physical erasing unit from the spare area 504 as the active physical erasing unit to continue writing the data corresponding to the write command from the host system 11. Further, when a number of the available physical erasing units in the spare area 604 is less than a preset value, the memory control circuit unit 404 (or the memory management circuit 502) performs a valid data merging procedure (also known as a garbage collection procedure) to merge the valid data in the data area 602, so as to re-associate the physical erasing units not storing with the valid data in the data area 602 to the spare area 604.

In order to identify data in each of the logical addresses is stored in which of the physical erasing units, in the present exemplary embodiment, the memory control circuit unit 404 (or the memory management circuit 502) may record mapping relations between the logical addresses and the physical erasing units. For example, in the present exemplary embodiment, the memory control circuit unit (or the memory management circuit 502) stores a logical address-physical address mapping table in the rewritable non-volatile memory module 406 for recording the physical erasing unit mapped by each of the logical addresses. When intending to access data, the memory control circuit unit 404 (or the memory management circuit 502) loads the logical address-physical address mapping table into the buffer memory 508 for maintenance and writes or reads data according to the logical address-physical address mapping table.

It is worth mentioning that, the buffer memory 508 is unable to store the mapping table recording the mapping relations of all the logical addresses due to limited capacity. Therefore, in the present exemplary embodiment, the memory control circuit unit 404 (or the memory management circuit 502) groups the logical addresses LBA(0) to LBA(H) into a plurality of logical zones LZ(0) to LZ(M), and configures one logical address-physical address mapping table for each of the logical zones. In particular, when the memory control circuit unit 404 (or the memory management circuit 502) intends to update the mapping table for one specific logical address, the logical address-physical address mapping table of the logical zone to which the logical address belongs is correspondingly loaded into the buffer memory 508 for updating.

In another exemplary embodiment, the control instructions of the memory management circuit 502 may also be stored, in form of program codes, into a specific area (e.g., a system area in the memory module exclusively used for storing the system data) of the rewritable non-volatile memory module 406. In addition, the memory management circuit 502 has a microprocessor unit (not illustrated), a ROM (not illustrated) and a RAM (not illustrated). Particularly, the ROM has a boot code, which is executed by the microprocessor unit to load the control instructions stored in the rewritable non-volatile memory module 406 to the RAM of the memory management circuit 502 when the memory control circuit unit 404 is enabled. Later, the control instructions are executed by the microprocessor unit to perform operations of writing, reading or erasing data.

Further, in another exemplary embodiment of the invention, the control instructions of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

Referring back to FIG. 5, the host interface 504 is coupled to the memory management circuit 502 and configured to couple to the connection interface unit 402, so as to receive and identify commands and data sent from the host system 11. In other words, the commands and data sent from the host system 11 are passed to the memory management circuit 502 through the host interface 504. In the present exemplary embodiment, the host interface 504 is compatible with the SATA standard. However, it should be understood that the present invention is not limited thereto, and the host interface 504 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 506 is coupled to the memory management circuit 502 and configured to access the rewritable non-volatile memory module 406. That is, data to be written to the rewritable non-volatile memory module 406 is converted to a foil rat acceptable to the rewritable non-volatile memory module 406 through the memory interface 506.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control a power of the memory storage apparatus 10.

The error checking and correcting circuit 512 is coupled to the memory management circuit 502 and configured to execute an error checking and correcting process to ensure the correctness of data. For example, when a write command is received by the memory management circuit 502 from the host system 11, the error checking and correcting circuit 512 generates an error checking and correcting code (ECC code) for data corresponding to the write command, and the memory management circuit 502 writes data and the ECC code corresponding to the write command to the rewritable non-volatile memory module 406. Subsequently, when reading the data from the rewritable non-volatile memory module 406, the memory management circuit 502 also read the error checking and correcting code corresponding to the data at the same timer so the error checking and correcting circuit 512 may execute the error checking and correcting operation for the read data according to the error checking and correcting code.

The temperature sensing circuit 514 is coupled to the memory management circuit 502 and configured to detect a temperature of the rewritable non-volatile memory module 406.

It should be noted that, when the data stored in a first physical programming unit in the physical erasing unit 410(0) is read by the memory control circuit unit 404 (or the memory management circuit 502) for multiple times (e.g., with a read count from hundred thousand times to million times), the memory control circuit unit 404 (or the memory management circuit 502) applies a read voltage to the memory cells in the first physical programming unit in each read operation. Therefore, the data stored in the first physical programming unit may generate error bits or may be lost due to the memory cells being repeatedly applied with the read voltage. Worth yet, the data stored in other physical programming units of the physical erasing unit 410(0) may also generate error bits or may be lost (i.e., this is known as the issue of "read-disturb").

Generally, data error or loss caused by the read-disturb may be prevented by determining whether "a read count" is greater than a read-disturb value. Specifically, in aforesaid example where the first physical programming unit is repeatedly read by the memory control circuit unit 404 (or the memory management circuit 502), since the data in the physical erasing unit 410(0) may generate error bits or may be lost after physical programming unit 410(0)-1 is read for multiple times, the memory control circuit unit 404 (or the memory management circuit 502) may determine whether the number of times the data stored in the first physical programming unit being read (i.e., the read count) is greater than a read-disturb threshold, so as to determine whether to move the data stored in the physical erasing unit 410(0). When the read count corresponding to the data stored in the first physical programming unit is greater than the read-disturb threshold, the memory control circuit unit 404 (or the memory management circuit 502) moves the data in the first physical programming unit to, for example, other spare physical programming units, so as to prevent the data originally stored in the first physical programming unit from generating excessive error bits or losing after being repeatedly read.

Further, data error or loss caused by the read-disturb may also be prevented by determining whether "the number of error bits" in the read data is greater than a read-disturb value. Specifically, when the memory control circuit unit 404 (or the memory management circuit 502) reads the read data from the first physical programming unit in the physical erasing unit 410(0), the memory control circuit unit 404 (or the memory management circuit 502) simultaneously reads the error checking and correcting code corresponding to the read data and performs the error checking and correcting operation for the read data according to the error checking and correcting code through the error checking and correcting circuit 512, so as to calculate an error bit count of the first physical programming unit according to the number of error bits of the data stored by the first physical programming unit. Then, the memory control circuit unit 404 (or the memory management circuit 502) may determine whether the number of error bits of the read data read from the first physical programming unit is greater than a read-disturb threshold. When the number of error bits corresponding to the read data read from the first physical programming unit is greater than the read-disturb threshold, the memory control circuit unit 404 (or the memory management circuit 502) moves the data in the first physical programming unit to, for example, other spare physical programming units, so as to prevent the data stored in the first physical programming unit from generating even more error bits or losing after being repeatedly read.

However, it should be noted that, the conventional methods using "the read count" or "the number of error bits" for preventing the read-disturb does not include a mechanism of dynamically changing "the read-disturb threshold" since those methods did not take into consideration of the condition that the physical erasing unit may be worn out. Herein, it is assumed that when the physical erasing unit 410(0) is worn out, excessive error bits may be generated when the memory control circuit unit 404 (or the memory management circuit 502) programs the data into the first physical programming unit in the physical erasing unit 410(0). In severe case, it also leads to data loss or data storage failure.

Accordingly, the present invention provides a memory managing method capable of dynamically adjusting "the read-disturb threshold" corresponding to the physical erasing unit according to state information of the rewritable non-volatile memory module 406, so as to effectively reduce the wearing probability and control the occurrence probability of the read-disturb for the physical erasing unit.

Figure 8:
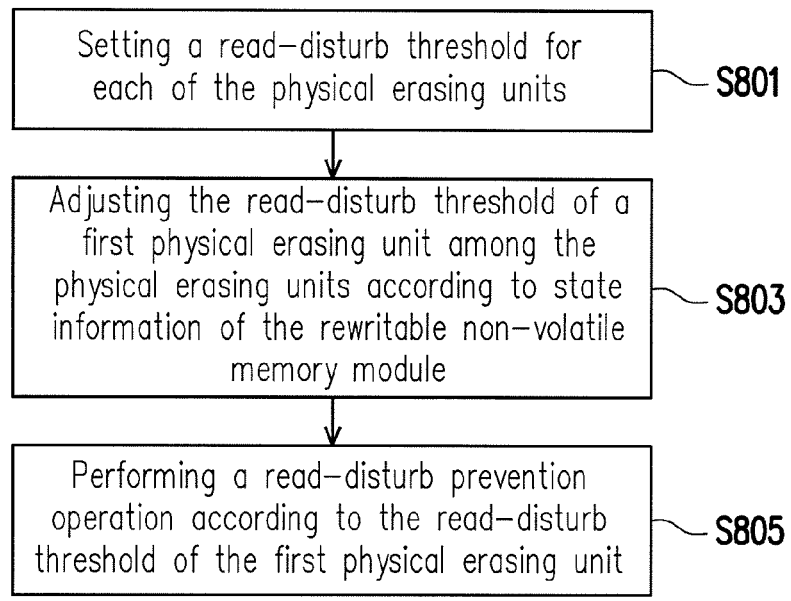
FIG. 8 is a flowchart illustrating a memory managing method according to an exemplary embodiment.

FIG. 8 is a flowchart illustrating a memory managing method according to an exemplary embodiment.

Referring to FIG. 8, in step S801, the memory control circuit unit 404 (or the memory management circuit 502) sets a read-disturb threshold for each of the physical erasing units 410(0) to 410(N).

Taking the physical erasing unit 410(0) for example, in an exemplary embodiment, the read-disturb threshold corresponding to the physical erasing unit 410(0) may be used for determining whether "the read count" of the data stored in one of the physical programming units in the physical erasing unit 410(0) is greater than a specific value, so as to determine whether to move the data in the physical erasing unit 410(0).

In another exemplary embodiment, the read-disturb threshold corresponding to the physical erasing unit 410(0) may be used for determining whether "the number of error bits" of the data read from one of the physical programming units in the physical erasing unit 410(0) is greater than a specific value, so as to determine whether to move the data in the physical erasing unit 410(0).

Next, in step S803, the memory control circuit unit 404 (or the memory management circuit 502) adjusts the read-disturb threshold of a first physical erasing unit according to state information of the rewritable non-volatile memory module 406. Then, in step S805, the memory control circuit unit 404 (or the memory management circuit 502) performs a read-disturb prevention operation according to the read-disturb threshold of the first physical erasing unit.

In an exemplary embodiment, the state information of the rewritable non-volatile memory module 406 may be an erase count of each of physical erasing units 410(0) to 410(N) in the rewritable non-volatile memory module 406. For example, the memory control circuit unit 404 (or the memory management circuit 502) records the erase count for each of the physical erasing units 410(0) to 410(N). Specifically, in the present exemplary embodiment, the memory control circuit unit 404 (or the memory management circuit 502) stores an erase count table in the rewritable non-volatile memory module 406 for recording the erase count of each of the physical erasing units 410(0) to 410(N), and the memory control circuit unit 404 (or the memory management circuit 502) loads the erase count table into the buffer memory 508 for maintenance. Each time when an erase operation is performed for one of the physical erasing units 410(0) to 410(N), the memory control circuit unit 404 (or the memory management circuit 502) may correspondingly record (or update) the erase count of the physical erasing unit (where the erase operation is performed on) in the erase count table. Taking the physical erasing unit 410(0) for example, when the memory control circuit unit 404 (or the memory management circuit 502) performs one erase operation for the physical erasing unit 410(0), the memory control circuit unit 404 (or the memory management circuit 502) may add one to the erase count corresponding to the physical erasing unit 410(0) in the erase count table.

Then, the memory control circuit unit 404 (or the memory management circuit 502) dynamically adjusts the read-disturb threshold corresponding to the physical erasing unit 410(0) according to the erase count corresponding to the physical erasing unit 410(0) in the erase count table, so as to change the timing for moving the data in the physical erasing unit 410(0). Herein, the read-disturb prevention operation may be aforesaid operation of moving the data in the physical erasing unit 410(0), that is, copying the data in the physical erasing unit 410(0) into other physical erasing units.

Further, in another exemplary embodiment, the state information of the rewritable non-volatile memory module 406 may be a temperature of the rewritable non-volatile memory module 406. For example, the memory control circuit unit 404 (or the memory management circuit 502) detects the temperature of the rewritable non-volatile memory module 406 through the temperature sensing circuit 514, and adjusts the read-disturb threshold for each of the physical erasing units 410(0) to 410(N) according to the temperature of the rewritable non-volatile memory module 406. Accordingly, the timing for moving the data in the physical erasing unit 410(0) may then be changed. Herein, the read-disturb prevention operation may be aforesaid operation of moving the data in the physical erasing unit 410(0), that is, copying the data in the physical erasing unit 410(0) into other physical erasing units.

By using aforesaid method, the wearing probability may be reduced and the occurrence probability of the read-disturb may be controlled for the physical erasing units 410(0) to 410(N). Description regarding the above will be explained in more details by the exemplary embodiments provided below.

First Exemplary Embodiment

In the first exemplary embodiment, the memory control circuit unit 404 (or the memory management circuit 502) records an erase count of each of the physical erasing units 410(0) to 410(N) in an erase count table, and dynamically adjusts a read-disturb threshold corresponding to the physical erasing unit 410(0) according to the erase count corresponding to the physical erasing unit 410(0) in the erase count table. Particularly, in the first exemplary embodiment, the memory control circuit unit 404 (or the memory management circuit 502) determines whether to perform the read-disturb prevention operation by determining whether "the read count" of the data in the physical programming unit 410(0)-1 of the physical erasing unit 410(0) is greater than the read-disturb threshold. As mentioned earlier, the physical erasing unit may be worn out after being erased for an excessive number of times. Herein, it is assumed that error bits may be generated while programming the data into the physical programming unit 410(0)-1 when the physical erasing unit 410(0) is worn out. At the time, if the read-disturb of the physical erasing unit 410(0) is prevented simply by using the read-disturb threshold with a fixed value, later, when the memory control circuit unit 404 (or the memory management circuit 502) repeatedly reads the first physical programming unit in the physical erasing unit 410(0) that is already worn out, it is highly possible that excessive error bits may be generated in the physical programming unit 410(0)-1 due to the physical erasing unit 410(0) being worn out and repeatedly read by the memory control circuit unit 404 (or the memory management circuit 502) even before the read count of the physical programming unit 410(0)-1 is not greater than the read-disturb threshold. In other words, when the read count of the physical programming unit 410(0)-1 is not yet greater than the read-disturb threshold, the physical programming unit 410(0)-1 may have the data stored in the physical programming unit 410(0)-1 generating excessive error bits, including error bits generated due to the physical erasing unit 410(0) being worn out plus additional errors caused by the first physical programming unit being repeatedly read.

Therefore, in the first exemplary embodiment, when the number of times the physical erasing unit 410(0) being erased increases, it is assumed that the memory control circuit unit 404 (or the memory management circuit 502) can dynamically decrease the read-disturb threshold corresponding to the physical erasing unit 410(0), so as to prevent the data in the physical programming unit 410(0)-1 from generating excessive error bits.

Specifically, when the memory control circuit unit 404 (or the memory management circuit 502) performs the erase operation for the physical erasing unit 410(0) (i.e., the first physical erasing unit), the memory control circuit unit 404 (or the memory management circuit 502) correspondingly adds one to the erase count of the first physical erasing unit. Then, when the erase count of the physical erasing unit 410(0) increases from a first count to a second count, the memory control circuit unit 404 (or the memory management circuit 502) adjusts the read-disturb threshold of the physical erasing unit 410(0) from a first threshold to a second threshold, wherein the second count is greater than the first count and the second threshold is less than the first threshold.

Figure 9:
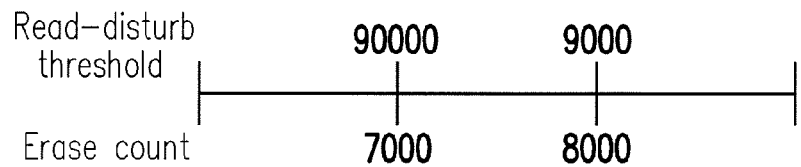
FIG. 9 illustrates a schematic diagram for adjusting the read-disturb threshold based on the erase count according to the first exemplary embodiment.

For instance, FIG. 9 illustrates a schematic diagram for adjusting the read-disturb threshold based on the erase count according to the first exemplary embodiment. Referring to FIG. 9, it is assumed that the erase count corresponding to the physical erasing unit 410(0) is recorded to be 7000 (i.e., the first count) and the read-disturb threshold corresponding to the physical erasing unit 410(0) is set as 90000 (i.e., the first threshold). After a period of time, it is assumed that the memory control circuit unit 404 (or the memory management circuit 502) increases the erase count corresponding to the physical erasing unit 410(0) to 8000 (i.e., the second count) after performing the erase operation for the physical erasing unit 410(0) for 1000 times. In this case, the memory control circuit unit 404 (or the memory management circuit 502) adjusts the read-disturb threshold corresponding to the physical erasing unit 410(0) from 90000 to 9000 (i.e., the second threshold) at the same time when the erase count of the physical erasing unit 410(0) increases to 8000, for example. As such, the memory control circuit unit 404 (or the memory management circuit 502) may dynamically decrease the read-disturb threshold corresponding to the physical erasing unit 410(0) when the number of times the physical erasing unit 410(0) being erased increases. However, it should be noted that, the invention is not intended to limit the values of the erase count and the read-disturb threshold, and the optimal correspondence relation between the erase count and the read-disturb threshold may be obtained by repeatedly experimenting with use of different types of the memory storage apparatus.

In addition, the memory control circuit unit 404 (or the memory management circuit 502) also records the read count for each of the physical programming units according to the number of times each physical erasing unit among the physical erasing units 410(0) to 410(N) being read.

For instance, the memory control circuit unit 404 (or the memory management circuit 502) may record the read count corresponding to the physical programming unit 410(0)-1 (i.e., the first physical programming unit) in a read count table according to the number of times the physical programming unit 410(0)-1 in the physical erasing unit 410(0) being read. In the present exemplary embodiment, the memory control circuit unit 404 (or the memory management circuit 502) stores the read count table in the rewritable non-volatile memory module 406 for recording the read count of each physical programming unit in each physical erasing unit, and the memory control circuit unit 404 (or the memory management circuit 502) loads the read count table into the buffer memory 508 for maintenance.

Then, the memory control circuit unit 404 (or the memory management circuit 502) determines whether the read count corresponding to the physical programming unit 410(0)-1 of the physical erasing unit 410(0) is greater than the read-disturb threshold of the physical erasing unit 410(0). When the read count corresponding to the first physical programming unit is greater than the read-disturb threshold of the physical erasing unit 410(0), the memory control circuit unit 404 (or the memory management circuit 502) copies the data stored in the physical erasing unit 410(0) to a physical erasing unit among the physical erasing units 410(1) to 410(N).

Specifically, when the memory control circuit unit 404 (or the memory management circuit 502) increases the erase count corresponding to the physical erasing unit 410(0) to 8000, the memory control circuit unit 404 (or the memory management circuit 502) also adjusts the read-disturb threshold corresponding to the physical erasing unit 410(0) to 9000. Then, it is assumed that the memory control circuit unit 404 (or the memory management circuit 502) continuously performs the read operation for the physical programming unit 410(0)-1 of the physical erasing unit 410(0). Accordingly, after performing the read operation for the physical programming unit 410(0)-1 for the 9001-th time, the memory control circuit unit 404 (or the memory management circuit 502) may copy the data stored in the physical erasing unit 410(0) to, for example, the physical erasing unit 410(F) in the spare area 604, perform the erase operation for the physical erasing unit 410(0), associate the physical erasing unit 410(0) to the spare area 604, and associate the physical erasing unit 410(F) to the data area 602. However, it should be noted that, the invention is not intended to limit the method for moving the data in the first physical erasing unit. In an exemplary embodiment, for example, after performing the read operation for the physical programming unit 410(0)-1 for the 9001-th time, the memory control circuit unit 404 (or the memory management circuit 502) may copy the data stored in the physical programming unit 410(0)-1 to, for example, the buffer memory 508, perform the erase operation for the physical erasing unit 410(0), and re-write the data originally stored in the physical programming unit 410(0)-1 from the buffer memory 508 back to the physical erasing unit 410(0).

By using aforesaid method, the memory control circuit unit 404 (or the memory management circuit 502) can dynamically decrease the read-disturb threshold corresponding to the physical erasing unit 410(0) when the number of times the physical erasing unit 410(0) being erased increases. As a result, the data of the first physical programming unit may be prevented from generating excessive error bits, including error bits generated in the physical programming unit 410(0)-1 due to the physical erasing unit 410(0) being worn out plus additional errors caused by the physical programming unit 410(0)-1 being repeatedly read, before the read count of the physical programming unit 410(0)-1 is greater than the read-disturb threshold.

Figure 10:
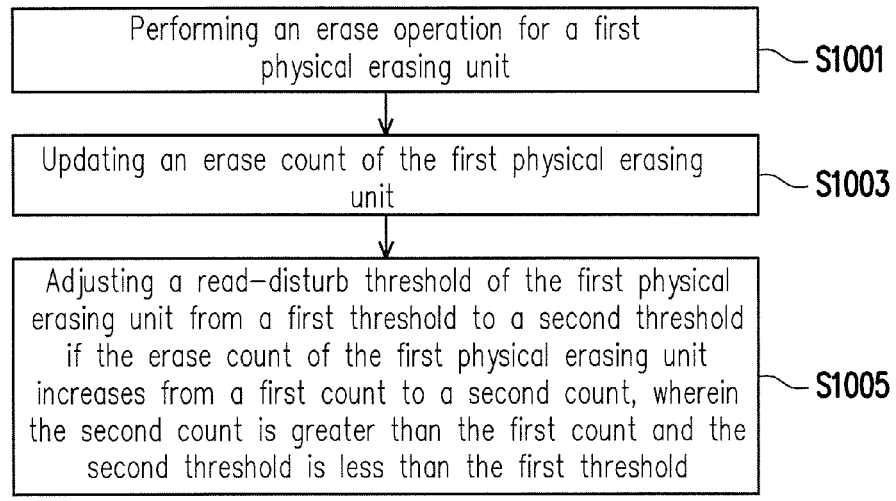
FIG. 10 illustrates a flowchart for adjusting the read-disturb threshold based on the erase count according to the first exemplary embodiment.

FIG. 10 illustrates a flowchart for adjusting the read-disturb threshold according to the erase count according to the first exemplary embodiment.

Referring to FIG. 10, in step S1001, the memory control circuit unit 404 (or the memory management circuit 502) performs an erase operation for a first physical erasing unit. Then, in step S1003, the memory control circuit unit 404 (or the memory management circuit 502) updates an erase count of the first physical erasing unit. Lastly, in step S1005, if the erase count of the first physical erasing unit increases from a first count to a second count, the memory control circuit unit 404 (or the memory management circuit 502) adjusts a read-disturb threshold of the first physical erasing unit from a first threshold to a second threshold, wherein the second count is greater than the first count and the second threshold is less than the first threshold.

Figure 11:
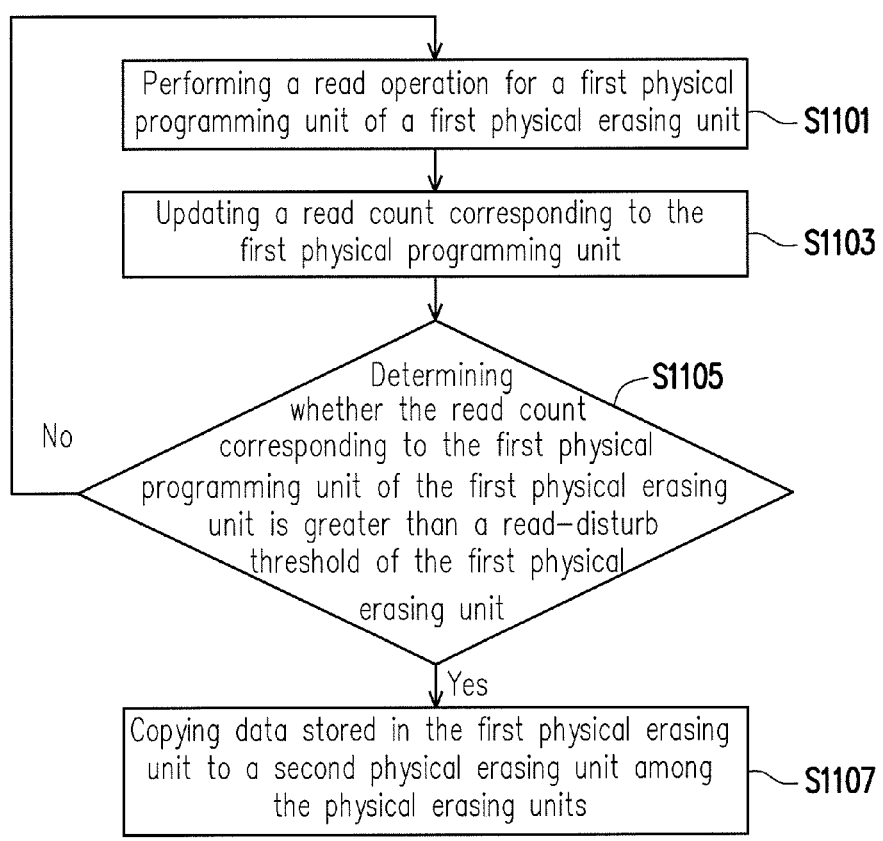
FIG. 11 is illustrates a flowchart for performing the read-disturb prevention operation according to the first exemplary embodiment.

FIG. 11 is illustrates a flowchart for performing the read-disturb prevention operation according to the first exemplary embodiment.

Referring to FIG. 11, in step S1101, the memory control circuit unit 404 (or the memory management circuit 502) performs a read operation for a first physical programming unit of a first physical erasing unit. Next, in step S1103, the memory control circuit unit 404 (or the memory management circuit 502) updates a read count corresponding to the first physical programming unit. Then, in step S1105, the memory control circuit unit 404 (or the memory management circuit 502) determines whether the read count corresponding to the first physical programming unit of the first physical erasing unit is greater than a read-disturb threshold of the first physical erasing unit. When the read count of the first physical programming unit of the first physical erasing unit is not greater than the read-disturb threshold of the first physical erasing unit, the method proceeds to step S1101. When the read count corresponding to the first physical programming unit of the first physical erasing unit is greater than the read-disturb threshold of the first physical erasing unit, the memory control circuit unit 404 (or the memory management circuit 502) copies data stored in the first physical erasing unit to a second physical erasing unit among the physical erasing units in step S1107.

Therefore, in the first exemplary embodiment of the invention, when the number of times one specific physical erasing unit being erased increases, the memory control circuit unit 404 (or the memory management circuit 502) can dynamically decrease the read-disturb threshold corresponding the specific physical erasing unit, so as to prevent the data from generating excessive error bits or losing when the read count of any one of physical programming units in the specific physical erasing unit is not yet greater than the read-disturb threshold.

Second Exemplary Embodiment

In the second exemplary embodiment, the memory control circuit unit 404 (or the memory management circuit 502) records an erase count of each of the physical erasing units 410(0) to 410(N) in an erase count table, and dynamically adjusts a read-disturb threshold corresponding to the physical erasing unit 410(0) according to the erase count in the erase count table. Particularly, in the second exemplary embodiment of the invention, the memory control circuit unit 404 (or the memory management circuit 502) determines whether to perform a read-disturb prevention operation by determining whether "the number of error bits" of reading data read from the physical programming unit 410(0)-1 of the physical erasing unit 410(0) is greater than the read-disturb threshold. As mentioned earlier, the physical erasing unit may be worn out after being erased for an excessive number of times. Herein, it is assumed that error bits may be generated while programming the data into the physical programming unit 410(0)-1 when the physical erasing unit 410(0) is worn out. If the read-disturb of the physical erasing unit 410(0) is prevented simply by using the read-disturb threshold with a fixed value, error bits exceeding the number of error bits may be generated due to the physical erasing unit 410(0) being worn out while writing the data into the physical programming unit 410(0)-1. At the time, the memory control circuit unit 404 (or the memory management circuit 502) moves the data in the physical erasing unit 410(0) and performs an erase operation for the physical erasing unit 410(0). In this case, when the memory control circuit unit 404 (or the memory management circuit 502) repeatedly writes one of the physical programming units in the physical erasing unit 410(0) that is already worn out, the physical erasing unit 410(0) may be worn out even more serious since the erase operation is repeatedly performed on the physical erasing unit 410(0) due to the number of error bits of the written data being greater than an error bit count threshold.

Therefore, in the second exemplary embodiment of the invention, when the number of times the physical erasing unit 410(0) being erased increases, it is assumed that the memory control circuit unit 404 (or the memory management circuit 502) can dynamically increase the read-disturb threshold corresponding to the physical erasing unit 410(0), so as to prevent the physical erasing unit 410(0) from being worn out even more serious due to excessive number of times of the erase operation being performed.

Specifically, when the memory control circuit unit 404 (or the memory management circuit 502) performs the erase operation for the physical erasing unit 410(0) (hereinafter, referred to as a first physical erasing unit), the memory control circuit unit 404 (or the memory management circuit 502) correspondingly adds one to the erase count of the first physical erasing unit. Then, when the erase count of the physical erasing unit 410(0) increases from a first count to a second count, the memory control circuit unit 404 (or the memory management circuit 502) adjusts the read-disturb threshold of the physical erasing unit 410(0) from a third threshold to a fourth threshold, wherein the second count is greater than the first count and the fourth threshold is greater than the third threshold.

Figure 12:
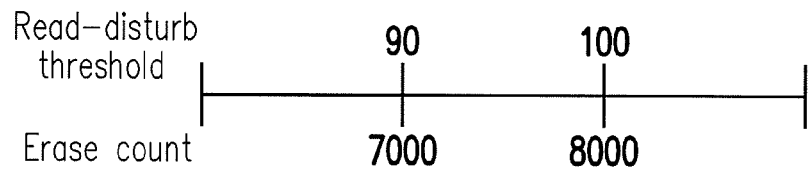
FIG. 12 illustrates a schematic diagram for adjusting the read-disturb threshold based on the erase count according to the second exemplary embodiment.

For instance, FIG. 12 illustrates a schematic diagram for adjusting the read-disturb threshold based on the erase count according to the second exemplary embodiment. Referring to FIG. 12, in one specific condition, it is assumed that the erase count corresponding to the physical erasing unit 410(0) is recorded to be 7000 (i.e., the first count) and the read-disturb threshold corresponding to the physical erasing unit 410(0) is set as 90 (i.e., the third threshold). After a period of time, it is assumed that the memory control circuit unit 404 (or the memory management circuit 502) increases the erase count corresponding to the physical erasing unit 410(0) to 8000 (i.e., the second count) after performing the erase operation for the physical erasing unit 410(0) for 1000 times. In this case, the memory control circuit unit 404 (or the memory management circuit 502) adjusts the read-disturb threshold corresponding to the physical erasing unit 410(0) from 90 to 100 (i.e., the fourth threshold), for example. As such, the memory control circuit unit 404 (or the memory management circuit 502) may dynamically increase the read-disturb threshold corresponding to the physical erasing unit 410(0) when the number of times the physical erasing unit 410(0) being erased increases. However, it should be noted that, the invention is not intended to limit the values of the erase count and the read-disturb threshold, and the optimal correspondence relation between the erase count and the read-disturb threshold may be obtained by repeatedly experimenting with use of different types of the memory storage apparatus.

In addition, the memory control circuit unit 404 (or the memory management circuit 502) further calculates an error bit count of the first physical programming unit according a number of error bits of the read data read from the first physical programming unit in the first physical erasing unit.

For instance, when the memory control circuit unit 404 (or the memory management circuit 502) reads data from the physical programming unit 410(0)-1 (i.e., the first physical programming unit) in the physical erasing unit 410(0), the memory control circuit unit 404 (or the memory management circuit 502) simultaneously reads the error checking and correcting code corresponding to the data and performs the error checking and correcting operation for the read data according to the error checking and correcting code through the error checking and correcting circuit 512, so as to calculate the error bit count of the physical programming unit 410(0)-1 according to the number of error bits of the data stored by the physical programming unit 410(0)-1. However, the present invention is intended to limit the timing for calculating the error bit count. In an exemplary embodiment, the memory control circuit unit 404 (or the memory management circuit 502) may also perform the error checking and correcting operation right after writing the data into the physical programming unit 410(0)-1 through the error checking and correcting circuit 512, so as to calculate the error bit count of the physical programming unit 410(0)-1 according to the number of error bits of the data stored by the physical programming unit 410(0)-1.

Then, the memory control circuit unit 404 (or the memory management circuit 502) determines whether the number of error bits of the read data read from the physical programming unit 410(0)-1 is greater than a read-disturb threshold of the physical erasing unit 410(0). When the number of error bits of the read data read from the physical programming unit 410(0)-1 is greater than the read-disturb threshold of the physical erasing unit 410(0), the memory control circuit unit 404 (or the memory management circuit 502) copies the data stored in the physical erasing unit 410(0) to other physical erasing unit.

Specifically, when the memory control circuit unit 404 (or the memory management circuit 502) increases the erase count corresponding to the physical erasing unit 410(0) to 8000, the memory control circuit unit 404 (or the memory management circuit 502) also adjusts the read-disturb threshold corresponding to the physical erasing unit 410(0) to 100. In this case, when the memory control circuit unit 404 (or the memory management circuit 502) reads the data from the physical programming unit 410(0)-1, the memory control circuit unit 404 (or the memory management circuit 502) simultaneously reads the error checking and correcting code corresponding to the data and performs the error checking and correcting operation for the read data according to the error checking and correcting code through the error checking and correcting circuit 512, so as to calculate the error bit count of the first physical programming unit according to the number of error bits of the data stored by the physical programming unit 410(0)-1. It is assumed that the error bit count of the physical programming unit 410(0)-1 is 101 at the time. Accordingly, after performing the read operation for the physical programming unit 410(0)-1, the memory control circuit unit 404 (or the memory management circuit 502) may copy the data stored in the physical erasing unit 410(0) to, for example, the physical erasing unit 410(F) in the spare area 604, perform the erase operation for the physical erasing unit 410(0), associate the physical erasing unit 410(0) to the spare area 604, and associate the physical erasing unit 410(F) to the data area 602. However, it should be noted that, the invention is not intended to limit the method for moving the data in the first physical erasing unit. In an exemplary embodiment, for example, after performing the read operation for the physical programming unit 410(0)-1 for the 101-th time, the memory control circuit unit 404 (or the memory management circuit 502) may copy the data stored in the first physical programming unit to, for example, the buffer memory 508, perform the erase operation for the physical erasing unit 410(0), and re-write the data originally stored in the first physical programming unit from the buffer memory 508 back to the physical erasing unit 410(0).

By using aforesaid method, the memory control circuit unit 404 (or the memory management circuit 502) can dynamically increase the read-disturb threshold corresponding to the physical erasing unit 410(0) when the number of times the physical erasing unit 410(0) being erased increases. As such, the problem of the erase operation being performed frequently on the physical erasing unit 410(0) that is caused by the number of error bits being greater than the read-disturb threshold right after writing data into the physical erasing unit 410(0) being worn out may then be prevented. Based on the second exemplary embodiment, the wearing of the physical erasing unit 410(0) may be effectively slow down.

Figure 13:
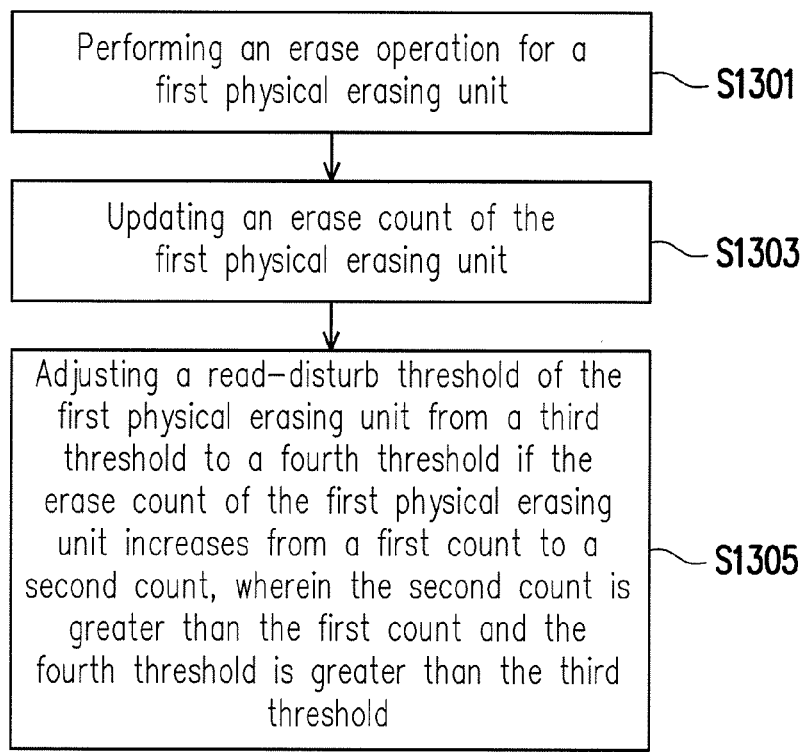
FIG. 13 illustrates a flowchart for adjusting the read-disturb threshold based on the erase count according to the second exemplary embodiment.

FIG. 13 illustrates a flowchart for adjusting the read-disturb threshold based on the erase count according to the second exemplary embodiment.

Referring to FIG. 13, in step S1301, the memory control circuit unit 404 (or the memory management circuit 502) performs an erase operation for a first physical erasing unit. Then, in step S1303, the memory control circuit unit 404 (or the memory management circuit 502) updates an erase count corresponding to the first physical erasing unit. Lastly, in step S1305, if the erase count of the first physical erasing unit increases from a first count to a second count, the memory control circuit unit 404 (or the memory management circuit 502) adjusts a read-disturb threshold of the first physical erasing unit from a third threshold to a fourth threshold, wherein the second count is greater than the first count and the fourth threshold is greater than the third threshold.

Figure 14:
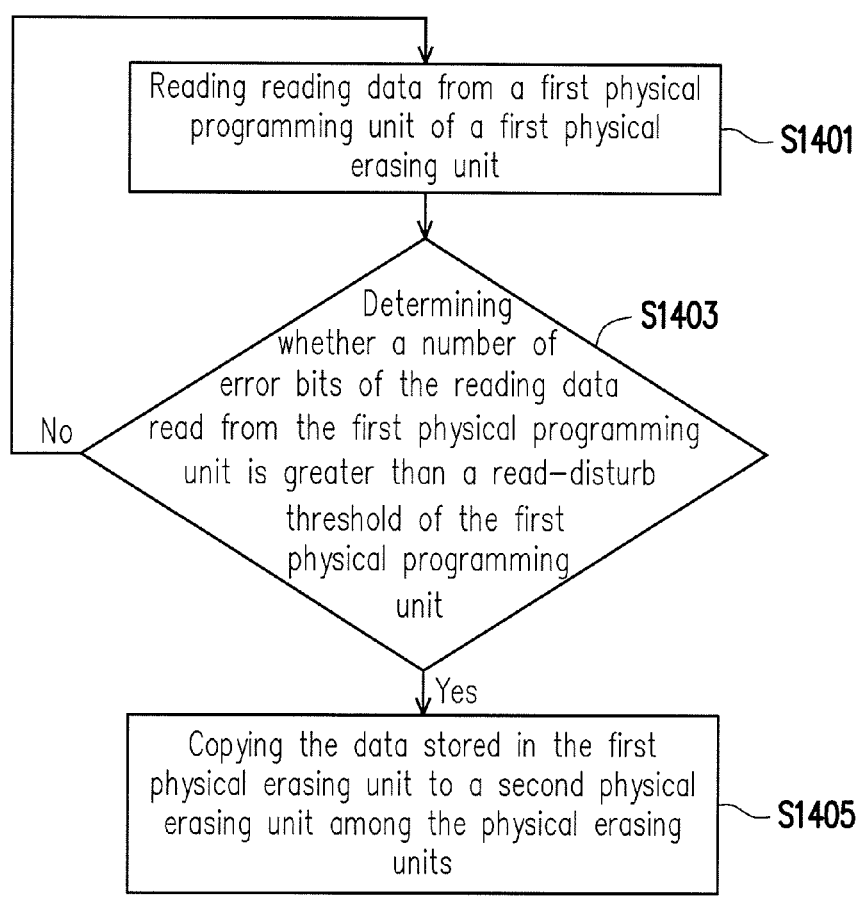
FIG. 14 is illustrates a flowchart for performing the read-disturb prevention operation according to the second exemplary embodiment.

FIG. 14 is illustrates a flowchart for performing the read-disturb prevention operation according to the second exemplary embodiment.

Referring to FIG. 14, in step S1401, the memory control circuit unit 404 (or the memory management circuit 502) reads reading data from a first physical programming unit of a first physical erasing unit. Next, in step S1403, the memory control circuit unit 404 (or the memory management circuit 502) determines whether a number of error bits of the read data read from the first physical programming unit is greater than a read-disturb threshold of the first physical programming unit. When the number of error bits of the read data read from the physical programming unit is not greater than the read-disturb threshold of the first physical erasing unit, the method proceeds to step S1401. When the number of error bits of the read data read from the first physical programming unit is greater than the read-disturb threshold of the first physical erasing unit, the memory control circuit unit 404 (or the memory management circuit 502) copies the data stored in the first physical erasing unit to a second physical erasing unit among the physical erasing units in step S1405.

Therefore, in the second exemplary embodiment of the invention, when the number of times one specific physical erasing unit being erased increases, the memory control circuit unit 404 (or the memory management circuit 502) can dynamically increase the read-disturb threshold corresponding to the specific physical erasing unit, so as to prevent the specific physical erasing unit from being worn out even more serious due to excessive number of times of the erase operation being performed.

Third Exemplary Embodiment

In the third exemplary embodiment, the memory control circuit unit 404 (or the memory management circuit 502) detects a temperature of the rewritable non-volatile memory module 406 through the temperature sensing circuit 514, and adjusts the read-disturb threshold for each of the physical erasing units 410(0) to 410(N) according to the temperature of the rewritable non-volatile memory module 406.

For instance, in the third exemplary embodiment of the invention, the read-disturb threshold is adjusted by determining "the number of error bits" and the temperature of the rewritable non-volatile memory module 406. Taking the physical erasing unit 410(0) and the physical programming unit 410(0)-1 for example, the memory control circuit unit 404 (or the memory management circuit 502) may determine whether to perform a read-disturb prevention operation by determining whether "the number of error bits" of reading data read from the physical programming unit 410(0)-1 of the physical erasing unit 410(0) is greater than the read-disturb threshold. Herein, when the number of times the physical erasing unit 410(0) being erased increases, it is assumed that the memory control circuit unit 404 (or the memory management circuit 502) can dynamically increase the read-disturb threshold corresponding to the physical erasing unit 410(0), so as to prevent the physical erasing unit 410(0) from being worn out even more serious due to excessive number of times of the erase operation being performed. However, it should be noted that, when the temperature of the rewritable non-volatile memory module 406 increases, error bits may be generated more easily when the memory control circuit unit 404 (or the memory management circuit 502) writes the data into the physical programming units in the rewritable non-volatile memory module 406. Therefore, later when the memory control circuit unit 404 (or the memory management circuit 502) writes the physical programming unit 410(0)-1 of the physical erasing unit 410(0) at high temperature again, the memory control circuit unit 404 (or the memory management circuit 502) may detect that the excessive error bits are already generated in the physical programming unit 410(0)-1. Accordingly, the memory control circuit unit 404 (or the memory management circuit 502) moves the data in the physical erasing unit 410(0) and performs an erase operation for the physical erasing unit 410(0). In this case, when the memory control circuit unit 404 (or the memory management circuit 502) repeatedly writes one of the physical programming units in the physical erasing unit 410(0) that is at high temperature and already worn out, the physical erasing unit 410(0) may be worn out even more serious since the erase operation is repeatedly performed on the physical erasing unit 410(0) due to the number of error bits of the written data being greater than an error bit count threshold.

Therefore, in the third exemplary embodiment of the invention, the memory control circuit unit 404 (or the memory management circuit 502) detects the temperature of the rewritable non-volatile memory module 406 through the temperature sensing circuit 514, and adjusts the read-disturb threshold of a first physical erasing unit according to the temperature of the rewritable non-volatile memory module 406. Particularly, if the temperature of the rewritable non-volatile memory module 406 increases from a first temperature to a second temperature, the memory control circuit unit 404 (or the memory management circuit 502) adjusts the read-disturb threshold of the first physical erasing unit from a fifth threshold to a sixth threshold, wherein the second temperature is greater than the first temperature and the sixth threshold is greater than the fifth threshold.

Figure 15A:
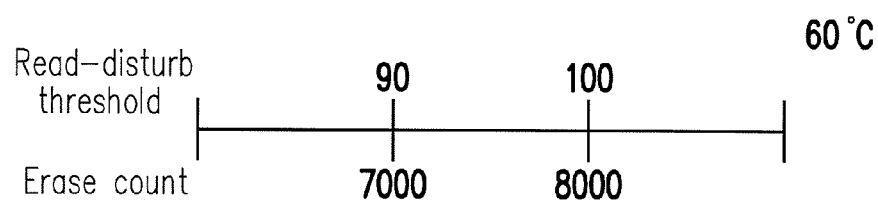
FIG. 15A, FIG. 15B and FIG. 15C illustrate schematic diagrams for adjusting the read-disturb threshold based on the temperature of the rewritable non-volatile memory module according to the third exemplary embodiment.
Figure 15B:
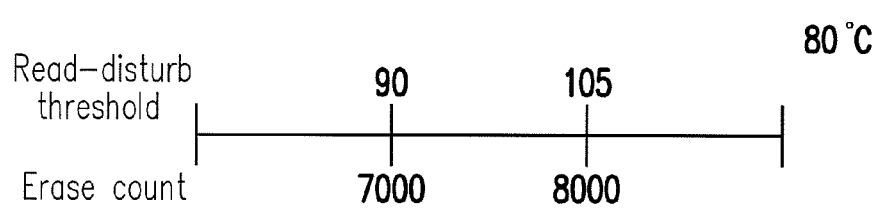
Figure 15C:
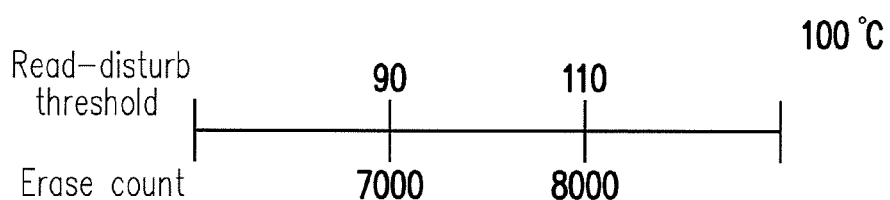

For instance, FIG. 15A, FIG. 15B and FIG. 15C illustrate schematic diagrams for adjusting the read-disturb threshold according to the temperature of the rewritable non-volatile memory module according to the third exemplary embodiment.

Referring to FIG. 15A, FIG. 15B and FIG. 15C together, in the condition of FIG. 15A, it is assumed that a temperature of the rewritable non-volatile memory module 406 is currently at 60° C., and the erase count corresponding to the physical erasing unit 410(0) is recorded to be 7000 (i.e., the first count) and the read-disturb threshold corresponding to the physical erasing unit 410(0) is set as 90 (i.e., the third threshold). After a period of time, it is assumed that the memory control circuit unit 404 (or the memory management circuit 502) increases the erase count corresponding to the physical erasing unit 410(0) to 8000 (i.e., the second count) after performing the erase operation for the physical erasing unit 410(0) for 1000 times. In this case, the memory control circuit unit 404 (or the memory management circuit 502) adjusts the read-disturb threshold corresponding to the physical erasing unit 410(0) from 90 to 100 (i.e., the fourth threshold), for example. As such, the memory control circuit unit 404 (or the memory management circuit 502) may dynamically increase the read-disturb threshold corresponding to the physical erasing unit 410(0) when the number of times the physical erasing unit 410(0) being erased increases.

Next, it is assumed that the temperature of the rewritable non-volatile memory module 406 increases from 60° C. to 80° C. As shown in FIG. 15B, the memory control circuit unit 404 (or the memory management circuit 502) may further adjust the read-disturb threshold from 100 to 105 (i.e., the fifth threshold), for example.

Then, it is assumed that the temperature of the rewritable non-volatile memory module 406 increases from 80° C. (i.e., the first temperature) to 100° C. (i.e., the second temperature). As shown in FIG. 15C, the memory control circuit unit 404 (or the memory management circuit 502) may further adjust the read-disturb threshold from 105 to 110 (i.e., the sixth threshold), for example.

In this case, when the memory control circuit unit 404 (or the memory management circuit 502) reads the data from the physical programming unit 410(0)-1, the memory control circuit unit 404 (or the memory management circuit 502) simultaneously reads the error checking and correcting code corresponding to the data and performs the error checking and correcting operation for the read data according to the error checking and correcting code through the error checking and correcting circuit 512, so as to calculate the error bit count of the physical programming unit 410(0)-1 according to the number of error bits of the data stored by the physical programming unit 410(0)-1. It is assumed that the error bit count of the physical programming unit 410(0)-1 is 111 at the time. Accordingly, after performing the read operation for the first physical programming unit, the memory control circuit unit 404 (or the memory management circuit 502) may copy the data stored in the physical erasing unit 410(0) to, for example, the buffer memory 508, and perform the erase operation for the physical erasing unit 410(0). Later, when the temperature of the rewritable non-volatile memory module 406 decreases to one specific temperature, the data originally stored in the physical programming unit 410(0)-1 may then be written from the buffer memory 508 back to the physical erasing unit 410(0).

However, it should be noted that, the present invention is not intended to limit the method for moving the data in the first physical erasing unit. Also, the present invention is not intended to limit the values of the erase count, the temperature of the rewritable non-volatile memory module 406 and read-disturb threshold, and the optimal correspondence relation between the values of the erase count, the temperature of the rewritable non-volatile memory module 406 and read-disturb threshold may be obtained by repeatedly experimenting with use of different types of the memory storage apparatus.

By using aforesaid method, the physical erasing unit 410(0) may be effectively prevented from being worn out even more serious due to excessive number of times of the erase operation being performed when the temperature of the rewritable non-volatile memory module 406 increases.

Figure 16:
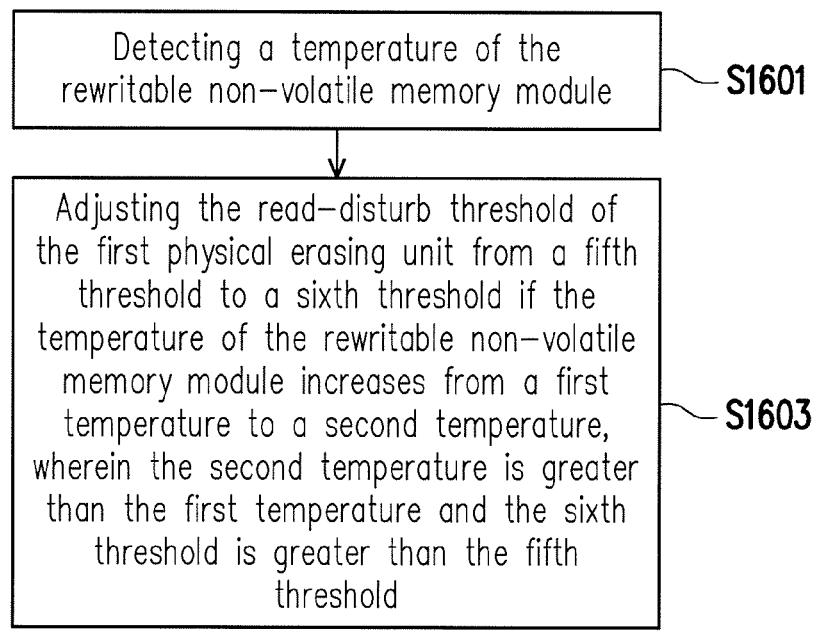
FIG. 16 illustrates a flowchart for adjusting of the read-disturb threshold based on the temperature according to the third exemplary embodiment.

FIG. 16 illustrates a flowchart for adjusting the read-disturb threshold according to the temperature according to the third exemplary embodiment.

In step S1601, the memory control circuit unit 404 (or the memory management circuit 502) detects a temperature of the rewritable non-volatile memory module 406 and adjusts a read-disturb threshold of the first physical erasing unit according to the temperature of the rewritable non-volatile memory module.

Next, in step S1603, if the temperature of the rewritable non-volatile memory module 406 increases from a first temperature to a second temperature, the memory control circuit unit 404 (or the memory management circuit 502) adjusts the read-disturb threshold of the first physical erasing unit from a fifth threshold to a sixth threshold, wherein the second temperature is greater than the first temperature and the sixth threshold is greater than the fifth threshold.

Therefore, in the third exemplary embodiment, when the temperature of the rewritable non-volatile memory module 406 increases, the memory control circuit unit 404 (or the memory management circuit 502) can dynamically increase the read-disturb threshold corresponding to the physical erasing unit 410(0), so as to prevent the physical erasing unit 410(0) from being worn out even more serious due to excessive number of times of the erase operation being performed.

It is worth mentioning that, in the third exemplary embodiment, the read-disturb threshold corresponding to each of the physical erasing units is dynamically adjusted according to the temperature of the rewritable non-volatile memory module 406. However, the invention is not limited thereto. In another present exemplary embodiment, the memory control circuit unit 404 (or the memory management circuit 502) may also set the read-disturb threshold by taking into consideration of both the temperature of the rewritable non-volatile memory module 406 and the erase count of each of the physical erasing units. In other words, the memory control circuit unit 404 (or the memory management circuit 502) in the first and second exemplary embodiments may further dynamically adjust the read-disturb threshold corresponding to each of the physical erasing units according to the temperature of the rewritable non-volatile memory module 406 as described in the third exemplary embodiment.

In summary, because the read-disturb and waring phenomenons will occur in the rewritable non-volatile memory module with use of the physical erasing unit over time, the invention proposes to dynamically adjust the read-disturb threshold according to the erase count of the physical erasing unit, so as to effectively reduce the wearing probability or the occurrence probability of the read-disturb for the physical erasing unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory managing method for a rewritable non-volatile memory module, wherein the rewritable non-volatile memory module comprises a plurality of physical erasing units, each physical erasing unit among the physical erasing units has a plurality of physical programming units, and the memory managing method comprises:

setting a read-disturb threshold for each of the physical erasing units;

adjusting the read-disturb threshold of a first physical erasing unit among the physical erasing units according to state information of the rewritable non-volatile memory module; and performing a read-disturb prevention operation according to the read-disturb threshold of the first physical erasing unit, wherein the step of performing the read-disturb prevention operation according to the read-disturb threshold of the first physical erasing unit comprises:

reading data from a first physical programming unit of the first physical erasing unit;

determining whether a number of error bits of the read data read from the first physical programming unit is greater than the read-disturb threshold of the first physical erasing unit; and copying data stored in the first physical erasing unit to a second physical erasing unit among the physical erasing units if the number of error bits of the read data read from the first physical programming unit is greater than the read-disturb threshold of the first physical erasing unit.

2. The memory managing method of claim 1, wherein the step of adjusting the read-disturb threshold of the first physical erasing unit among the physical erasing units according to the state information of the rewritable non-volatile memory module comprises:
recording an erase count for each of the physical erasing units; and
adjusting the read-disturb threshold of the first physical erasing unit from a third threshold to a fourth threshold if the erase count of the first physical erasing unit increases from a first count to a second count,
wherein the second count is greater than the first count and the fourth threshold is greater than the third threshold.

3. A memory managing method for a rewritable non-volatile memory module, wherein the rewritable non-volatile memory module comprises a plurality of physical erasing units, each physical erasing unit among the physical erasing units has a plurality of physical programming units, and the memory managing method comprises:
setting a read-disturb threshold for each of the physical erasing units;
adjusting the read-disturb threshold of a first physical erasing unit among the physical erasing units according to a temperature of the rewritable non-volatile memory module; and
performing a read-disturb prevention operation according to the read-disturb threshold of the first physical erasing unit,
wherein the step of adjusting the read-disturb threshold of the first physical erasing unit according to the temperature of the rewritable non-volatile memory module comprises:
adjusting the read-disturb threshold of the first physical erasing unit from a fifth threshold to a sixth threshold if the temperature of the rewritable non-volatile memory module increases from a first temperature to a second temperature,
wherein the second temperature is greater than the first temperature and the sixth threshold is greater than the fifth threshold.

4. A memory storage apparatus, comprising:
a connection interface unit configured to couple to a host system;
a rewritable non-volatile memory module having a plurality of physical erasing units, each physical erasing unit among the physical erasing units having a plurality of physical programming units; and
a memory control circuit unit coupled to the connection interface unit and the rewritable non-volatile memory module,
wherein the memory control circuit unit is configured to set a read-disturb threshold for each of the physical erasing units,
the memory control circuit unit is further configured to adjust the read-disturb threshold of a first physical erasing unit among the physical erasing units according to state information of the rewritable non-volatile memory module, and
the memory control circuit unit is further configured to perform a read-disturb prevention operation according to the read-disturb threshold of the first physical erasing unit,
wherein in the operation of performing the read-disturb prevention operation according to the read-disturb threshold of the first physical erasing unit, the memory control circuit unit is further configured to read reading data from a first physical programming unit of the first physical erasing unit, and determine whether a number of error bits of the read data read from the first physical programming unit is greater than the read-disturb threshold of the first physical erasing unit,
wherein the memory control circuit unit is further configured to copy data stored in the first physical erasing unit to a second physical erasing unit among the physical erasing units if the number of error bits of the read data read from the first physical programming unit is greater than the read-disturb threshold of the first physical erasing unit.

5. The memory storage apparatus of claim 4, wherein in the operation of adjusting the read-disturb threshold of the first physical erasing unit among the physical erasing units according to the state information of the rewritable non-volatile memory module,
the memory control circuit unit is further configured to record an erase count for each of the physical erasing units, and
the memory control circuit unit is further configured to adjust the read-disturb threshold of the first physical erasing unit from a third threshold to a fourth threshold if the erase count of the first physical erasing unit increases from a first count to a second count,
wherein the second count is greater than the first count and the fourth threshold is greater than the third threshold.

6. A memory storage apparatus, comprising:
a connection interface unit configured to couple to a host system;
a rewritable non-volatile memory module having a plurality of physical erasing units, each physical erasing unit among the physical erasing units having a plurality of physical programming units; and
a memory control circuit unit coupled to the connection interface unit and the rewritable non-volatile memory module,
wherein the memory control circuit unit is configured to set a read-disturb threshold for each of the physical erasing units,
the memory control circuit unit is further configured to adjust the read-disturb threshold of a first physical erasing unit among the physical erasing units according to a temperature of the rewritable non-volatile memory module, and
the memory control circuit unit is further configured to perform a read-disturb prevention operation according to the read-disturb threshold of the first physical erasing unit,
wherein in the operation of adjusting the read-disturb threshold of the first physical erasing unit according to the temperature of the rewritable non-volatile memory module,
the memory control circuit unit is further configured to adjust the read-disturb threshold of the first physical erasing unit from a fifth threshold to a sixth threshold if the temperature of the rewritable non-volatile memory module increases from a first temperature to a second temperature,
wherein the second temperature is greater than the first temperature and the sixth threshold is greater than the fifth threshold.

* * * * *